United States Patent [19]
Menard et al.

[11] Patent Number: 5,276,465
[45] Date of Patent: Jan. 4, 1994

[54] PLOTTER DRUM

[75] Inventors: Alan W. Menard, Bolton; Dana W. Seniff, South Glastonbury; Kenneth R. Petersen, West Hartford, all of Conn.

[73] Assignee: Gerber Systems Corporation, South Windsor, Conn.

[21] Appl. No.: 839,398

[22] Filed: Feb. 20, 1992

[51] Int. Cl.$^5$ .............................................. B41J 13/10
[52] U.S. Cl. ..................................... 346/134; 271/276
[58] Field of Search ................ 346/138, 134; 271/276, 271/196; 248/309.3, 362, 363

[56] References Cited

U.S. PATENT DOCUMENTS

| | | | |
|---|---|---|---|
| 2,816,160 | 12/1957 | Young | 271/276 |
| 3,986,455 | 10/1976 | Jeschke et al. | 271/276 |
| 4,945,238 | 7/1990 | Muraishi | 271/276 |
| 4,963,217 | 10/1990 | Pavone | 156/295 |

Primary Examiner—George H. Miller, Jr.
Assistant Examiner—N. Le
Attorney, Agent, or Firm—McCormick, Paulding & Huber

[57] ABSTRACT

A drum for a photoplotter has a base having a partially cylindrical recess formed therein which recess being defined by in part by a plurality of elevated surfaces providing a support bed on which is mounted a sheet of material providing an exposed surface for supporting a substrate thereon. The drum is formed by a method whereby a tool is provided about which the sheet material is drawn and is moved into engagement with the bed and is caused to maintain this shape by an adhesive interposed therebetween. A method for mechanically compensating for surface irregularities by fixing the scanner relative to the support surface after displacements have been made is also provided.

8 Claims, 6 Drawing Sheets

PLOTTER DRUM

CROSS REFERENCE TO RELATED APPLICATIONS

This application relates to co-pending U.S. application Ser. No. 07/838,500, filed on Feb. 19, 1992 in the name of H. Joseph Gerber et al. and entitled A Method and Apparatus for Enhancing the Accuracy of Scanner Systems, which application being commonly assigned with the assignee of the present invention.

BACKGROUND OF THE INVENTION

This invention relates to internal drum photoplotters and the support on which a substrate is held during a plotting operation, and deals more particularly with a drum for such plotters and an associated method of making the same wherein the drum can be readily fabricated with a surface having a highly cylindrical shape; the invention further deals with a method of mechanically compensating for surface irregularities which may otherwise occur by precisely adjusting the orientation of the scanning means relative to the support surface.

Internal drum photoplotters utilize a section of a cylindrical surface to support a photosensitive film during a plotting operation. This surface must be as perfectly cylindrical as possible to insure the highest degree of plotting accuracy achievable on the film or photosensitive substrate supporting it. Any irregularity in this surface will cause an undesirable variance to be made in the lines projected onto the substrate. The need to a surface having as few irregularities as possible is to some extent also recognized in flat bed photoplotters. But since a planar support surface is involved in this case, providing such a conforming surface is more easily effected than one having a cylindrical shape. For example, in Robert J. Pavone U.S. Pat. No. 4,963,217 issued on Oct. 16, 1990, and being commonly assigned with the assignee of the present invention, it is disclosed to form an accurate planar surface by using a tool presenting a highly accurate flat surface to be transferred to the support surface of the platen constituted by sheet material. This is done by applying a layer of adhesive to one side of the sheet and placing it face down on its opposite side onto the tool. Subsequently, a honeycomb infrastructure is moved down into the exposed adhesive, such that when the adhesive dries, the support surface is held in the desired planar condition by the infrastructure, regardless of whether it entirely seats flushly against it. By contrast, to fabricate a section of a cylindrical surface in a drum plotter using sheet material, a more complicated process must be employed because the supporting drum base presents a surface which is curved requiring that the sheet be maintained in a curved condition during the attaching process. Further complicating this process, is the vacuum system provided in the base for dispersing vacuum evenly below the support surface so that the film can be drawn against the contour it presents. Such a system must be one in which the sheet material constituting the support surface is held rigidly in a cylindrical shape while nevertheless being capable of permitting the free flow of air communicating through the surface and thereafter through the base.

Accordingly, it is an object of the present invention to provide a drum for use in an internal drum raster photoplotter which can be readily fabricated so as to provide a support surface which is highly cylindrical for holding and supporting a substrate during a plotting operation.

It is a further object of the present invention to provide a drum support of the aforementioned type wherein the drum is made by a process allowing the support surface to be readily assembled with the highest possible degree of accuracy.

The invention further resides in a method of fixturing the scanner means of the photoplotter to account for defects or irregularities that may exist in the surface in order to minimize the need to electronically compensate for such variances in the scanning process.

Further objects and details of the invention will become apparent from the following description and appended claims.

SUMMARY OF THE INVENTION

The invention resides in a drum support for use in a photoplotter having a two part construction comprising a sheet of material having one surface and an opposite other surface, with the one surface adapted for supporting an article thereon and a body portion having a partially cylindrical recess formed therein oriented about a given longitudinal axis, the recess having means for presenting a plurality of elevated surfaces together defining the partially cylindrical recess and providing a bed for supporting the other surface of the sheet of material. The sheet material and the body portion are attached by means interposed therebetween and a means is provided in the sheet material for communicating air between the one surface of the sheet material and the body portion of the drum.

The invention further resides in a method of forming a highly cylindrical surface on a base comprising the steps of: providing a tool having at least a section of a substantially cylindrically perfect surface disposed outwardly thereof; providing a flexible piece of sheet material and drawing it into intimate contact with the exposed highly cylindrical surface of the tool; positioning the tool with the sheet material over a drum support base having means presenting elevated support surfaces which together present a section of a generally cylindrical surface; interposing an adhesive means in an uncured state between the exposed surface of the sheet and the upstanding supporting surfaces of the support drum base and causing the sheet to become bonded to the base while simultaneously being mounted on the tool; and allowing the adhesive to cure and harden so that the highly cylindrical configuration of the tool is maintained in the sheet material and thereafter releasing the sheet material from the tool such that the sheet material maintains the configuration of the tool.

Also, the invention resides in a method of compensating for support surface irregularities in the cylindrical section of drum in an internal photoplotter of the type having a beam projecting device having a line of travel positioned at a given distance from the surface. The method comprises: mounting the beam projecting device on a frame having at least three depending legs; providing a base having an upwardly extending support surface presenting a section of a substantially cylindrical surface and having means for receiving each of the legs of the projecting device support frame; suspending the frame above the surface such that the depending ends of the frame are received but are not supported by the means provided within the base for receiving the depending legs of the frame; accounting for any irregularity in the surface by causing the frame to be displaced to compensate for the irregularity; and fixing the frame against movement to the base by introducing means between the depending portions of each of said legs and the receiving means of said base by filling the space therebetween and allowing said filler to rigidify before releasing the frame from suspension thereby achieving a desired spatial relationship between the surface and the beam projecting device.

DETAILED DESCRIPTION OF THE PREFERRED EMBODIMENT

Figure 1:
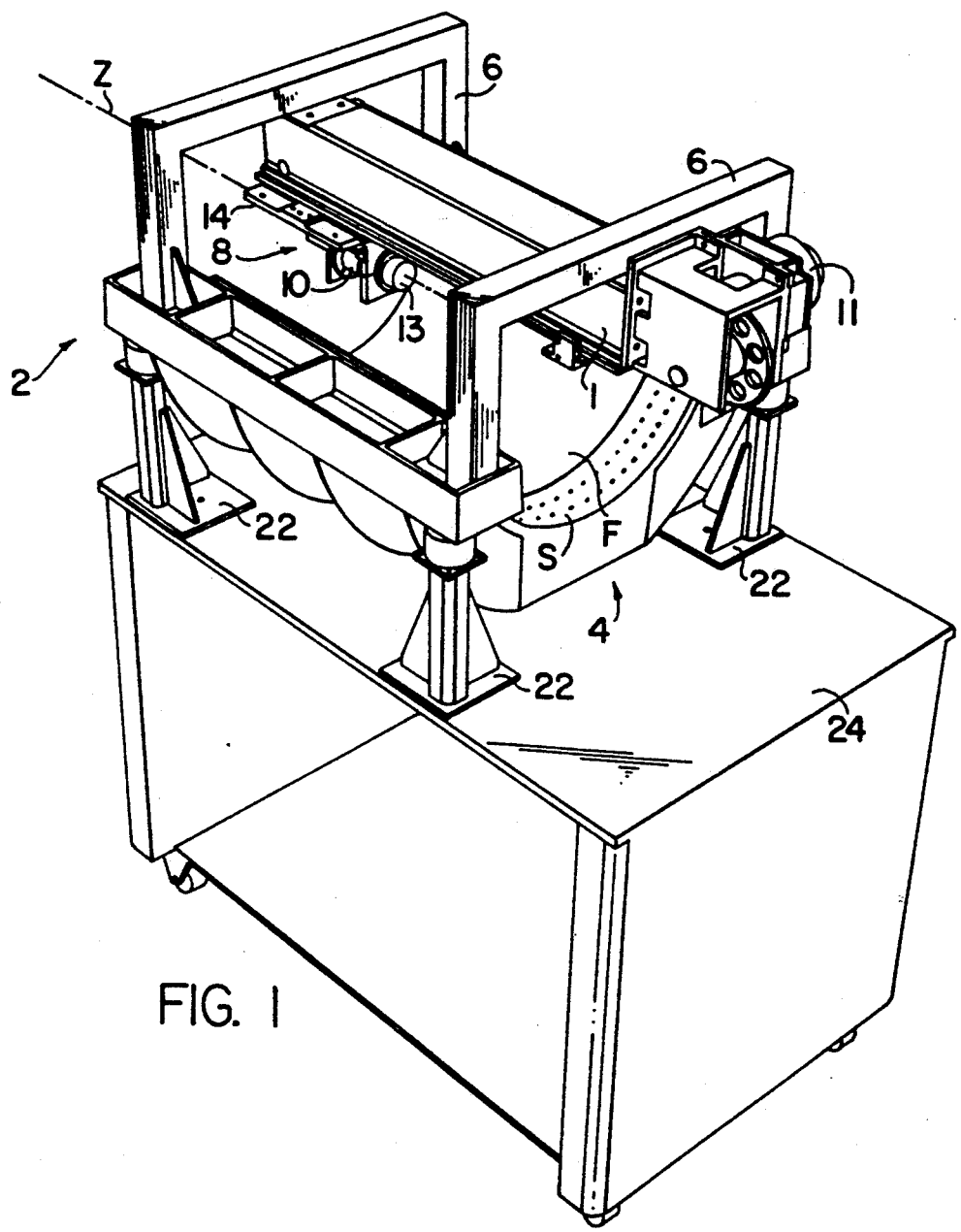
FIG. 1 is a perspective view of the internal drum photoplotter employing the present invention.

Referring first to FIG. 1, a photoplotter is shown as 2 and embodies the drum support 4 of the present invention having an outwardly facing support surface S. The photoplotter further includes a scanning means 8 mounted to a frame 6 in accordance with one aspect of the invention so as to be fixed to the drum support and to support the scanning means above the drum for projecting an image in raster format on a substrate F supported by the drum surface S. The scanning means includes a radiant energy or beam emitter means (not shown) fixed to the frame 6, a beam directing means, such as a spinner mirror 10, which both travels along and rotates about a single axis herein indicated as Z while being carried for such movement by a carriage 14 disposed for movement along a track 1 in the indicated Z axis. The mirror 10 is driven in rotation about this axis by a drive motor 13 carried by a carriage 14, and the carriage 14 is driven linearly along the track 1 by a carriage drive motor 11. The beam emitting means is secured to one end of the carriage and emits a modulated light beam projected onto the spinner mirror beam which is directed downward toward the surface S of the drum to expose a line or point on a substrate, which in this example is the film F. The combined movements of the carriage 14, the controlled rotation of the spinner mirror by the drive motor 13 and the modulation of the beam projected by the emitter means are coordinated by a controller such that as the mirror 10 is moved along and rotated about the axis Z, an image is exposed by the projection of individual rasters on the film F.

Figure 2:
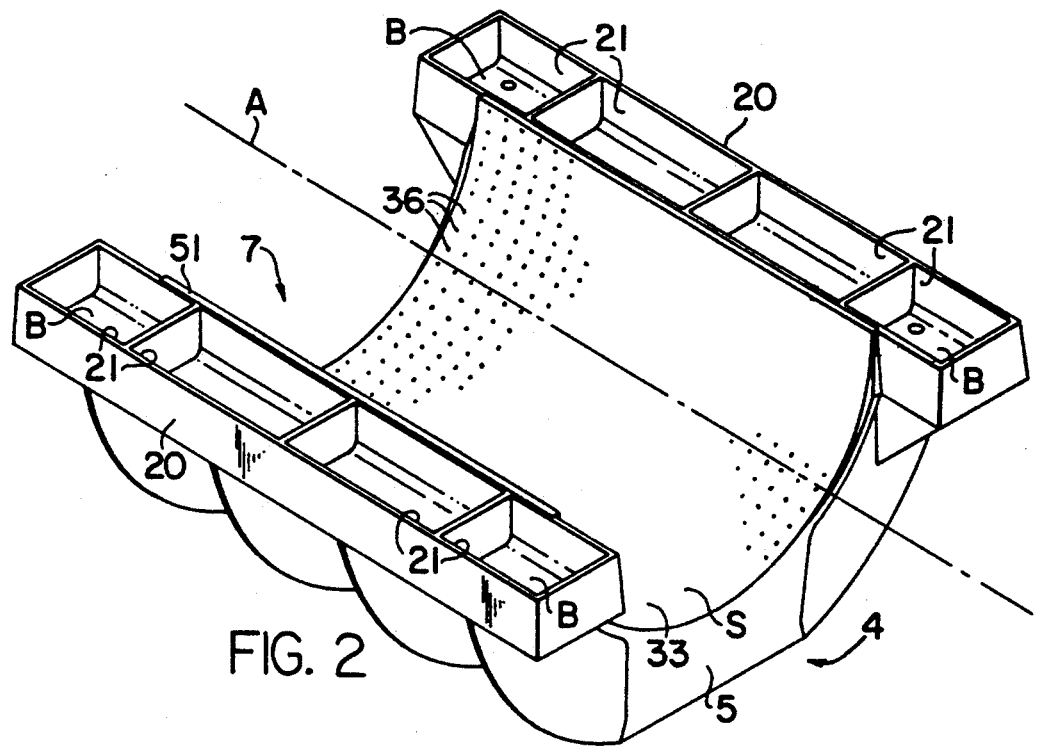
FIG. 2 is a perspective view of the drum support of the photoplotter shown in FIG. 1.
Figure 3:
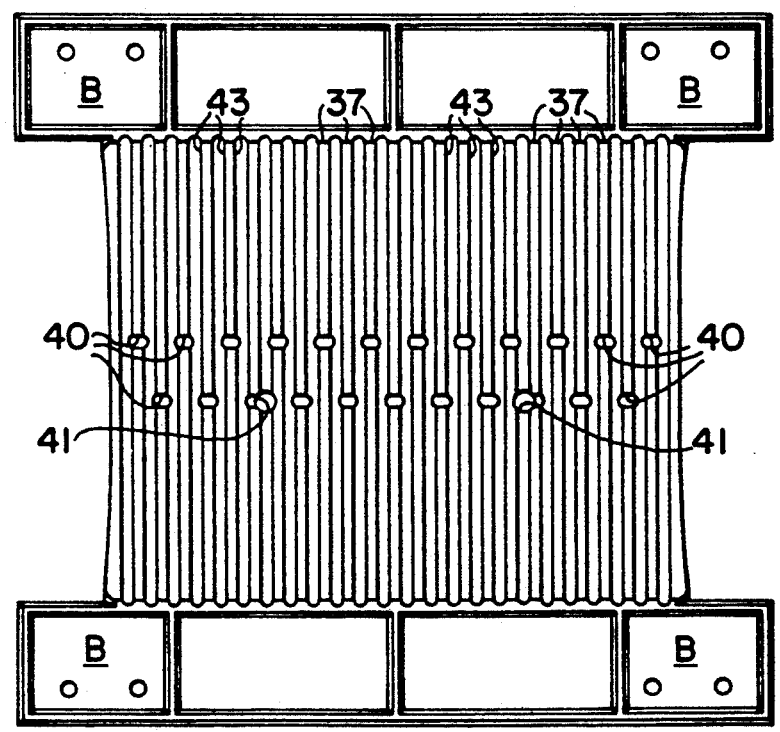
FIG. 3 is a top plan view of the drum support of FIG. 2.

In accordance with the invention, it should be seen that the drum support 4 has a body portion 5 in which is disposed a half cylinder recess 7 oriented about a longitudinal axis A. The term "half cylinder" means that the recess 7 has the shape of a cylinder cut along its longitudinal extent through its central axis, in this case being axis A. In addition to its body portion, the drum support 4 has two outwardly extending flange portions 20,20 each generally disposed along the opposed lateral side edges of the recess 7 and integrally connected therewith. From the top as seen in FIG. 2, and as will further be discussed in greater detail with reference to FIGS. 7 and 8, the flange portions are box-like in configuration having a floor B and are themselves divided into four compartments 21,21 which receive the depending legs of the scanner support frame 6 in a manner that will hereinafter be discussed. These flange portions further allow the drum to be supported by stands 22,22 which are inturn supported on a surface 24, such as provided by a table or a floor.

Figure 4:
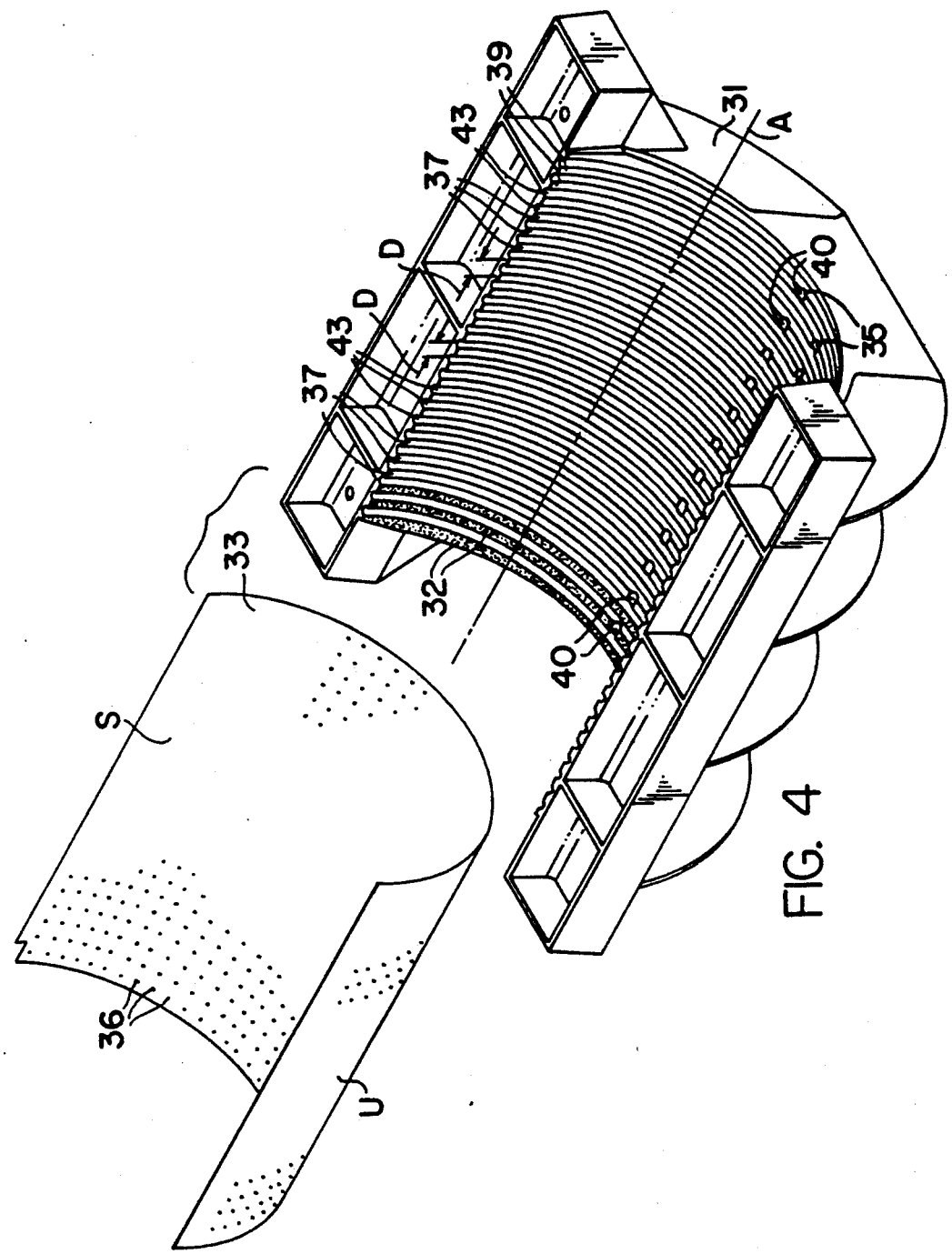
FIG. 4 is a perspective view of the drum support shown with the support sheet removed to reveal the underlying vacuum system.

As shown in FIG. 4, the drum support 4 is fabricated from a two-part construction, with the first part or base 31 being the previously discussed combination of the base and flange portions and the second part 33 being constituted by a skin or thin sheet of material attached to the first part through the intermediary of an attachment means 32 interposed therebetween. The support sheet 33 has one face U facing the underlying base 31 and an opposite other face S disposed outwardly upon which is supported the substrate F. For holding the substrate F onto and against the surface S of the skin, a plurality of pin holes 36,36 are provided in it and are disposed in rows and in a given orientation so as to communicate with a vacuum means 35 provided below it for holding the substrate down onto the surface during a plotting operation.

The vacuum means 35 making up part of the base 31 is defined in part by a plurality of arcuately shaped ribs 37,37 spaced from one another by the distance D, and each presenting an associated elevated surface 39,39 which together define the generally half cylindrical shape of the recess 7 and provide a bed upon which the sheet 33 rests. In other words, these arcuate surfaces have centers of curvature which are substantially coincident with one another so as to define the central axis A of the recess 7. Below the elevated surfaces 39,39 of the ribs is disposed channel means 43,43 for communicating vacuum along circumferential paths underlying the correspondingly situated rows of the pin holes 36,36 in the sheet 33. The ribs are interrupted approximately midlength by gaps 40,40 allowing air to migrate longitudinally thereof from two ducts 41,41 formed in the base 31 through which a vacuum source (not shown) is introduced. For blocking the end interface between the sheet 33 and the open sides of the channel means 43,43, an angle member 51 is bonded at this juncture. The drum with its ribs and flanges may be formed in a variety of different ways and from different materials, but in the preferred embodiment, it is cast as a unitary piece from aluminum. In sum it should be seen that the sheet 33 is supported by the ribs 37,37 so as to maintain its desired cylindricity of shape. This is effected through the intermediary of the attachment means 32 disposed between the lower sheet surface and the elevated surfaces 39,39 which holds the sheet 33 in place by virtue of an adhesive bond therebetween.

Figure 5:
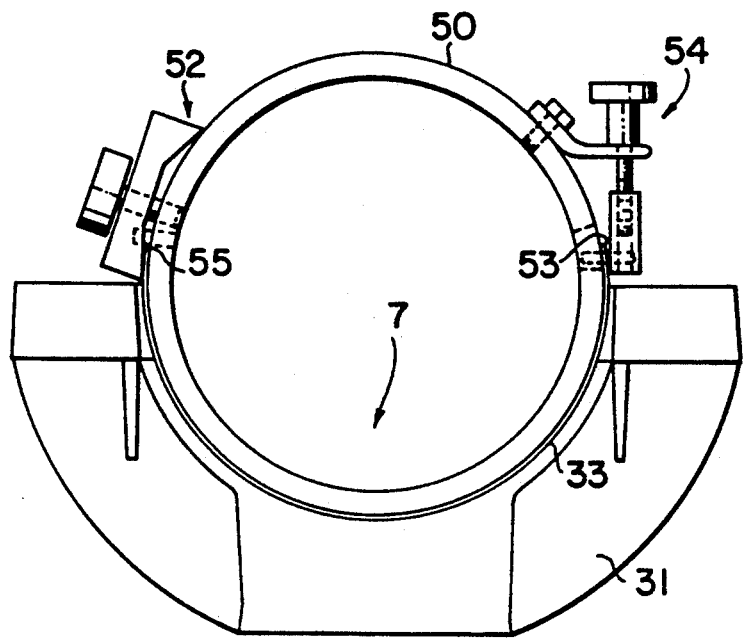
FIG. 5 shows schematically the final step in the process by which the support sheet is bonded to the underlying drum base using a cylindrical tool.
Figure 6:
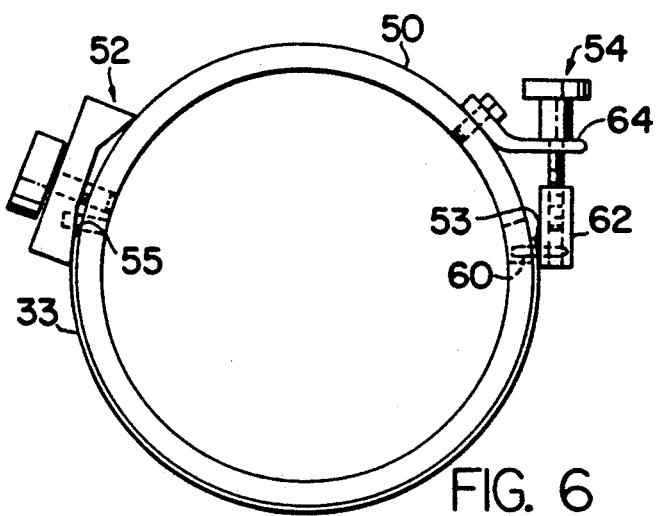
FIG. 6 is an end view of the tool used for applying the support sheet to the drum base of FIG. 5.
Figure 7:
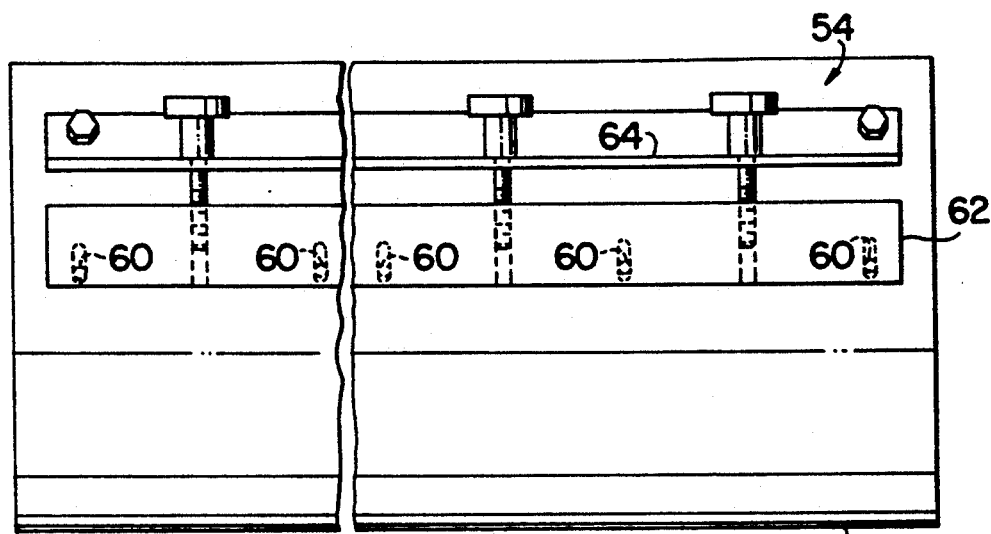
FIG. 7 is a side elevational view of the tool of FIG. 6 looking at it from the right side.

Referring now to FIGS. 5-7, and particular to the method by which the support sheet 33 is attached to the base part, it should be seen that a tool 50 is provided for mounting the sheet 33 to it for subsequent application onto the base 31. The tool 50 includes a clamp means 52 disposed on one side thereof for securing one lateral side edge 55 of the sheet 33 against movement to it. The tool 50 further includes a tensioning means 54 disposed diametrically oppositely of the clamp means 52 and adapted to releasably hold the other opposite side edge 53 of the sheet 33. For this purpose, the sheet 33 is provided along its other side edge 53 with a plurality of openings which are so sized and positioned as to receive pins 60,60 carried by the tensioning means 54. Upon appropriately manipulating the means 54, the sheet 33 is caused to be drawn into intimate contact with the outer cylindrical surface of the tool. The tensioning means 54 can take many forms, but in the preferred embodiment it comprises a bar 62 which is threadily engaged by screws rotatably mounted in a flange 64 fixed diametrically oppositely of the clamp means 54.

It should be appreciated here that the outer surface of the tool 50 is precision machined to have a highly accurate right angular cylindricity such that by pulling the sheet 33 tightly across its outer surface, the sheet is made to conform to this shape so long as it continues to be tensioned. To this end, the material constituting the sheet 33, which may for example, be formed from aluminum and given a relatively thin thickness of about 0.02 inch, is therefore flexible enough to be manipulated in this manner, yet is resistant to elongation relative to the tension applied by the means 54. Prior to being mounted on the tool 50 in this manner, the sheet material 33 is first conditioned by causing the openings 36,36 to be formed by drilling them in rows which will ultimately become aligned with the location of the channel means 43,43 in the base 31.

The means 32 for attaching the sheet 33 to the base 31 is next applied to the elevated surfaces 39,39 of the ribs 37,37 in order to effect bonding therebetween. The means 32 may take many different forms, but in the preferred embodiment of the invention, it is applied as a layer of curable adhesive. One example of such an adhesive suitable for this purpose is one made by EMERSON AND CUMING, INC., under the product name "Eccobond 45SC Black" (resin) and 15SC Black (catalyst). Once the sheet 31 is mounted to the tool 50 in the manner discussed above, and before the means 32 cures, the tool 50 is then suspended over the base part 31 of the drum by an appropriate suspension means and is thereafter lowered downward toward the ribs just slightly enough to bring the lower surface of the sheet 33 into engagement with the layer of adhesive disposed on the elevated surfaces 39,39. However, once the means 32 cures and hardens, the sheet 33 is released from the tool 50 by loosening of the clamp and tensioning means 52,54. With the attachment means 32 now holding the sheet 33 in the sam configuration in which it was held previously by the tool 50, a support surface is formed possessing the desired cylindricity.

Figure 9:
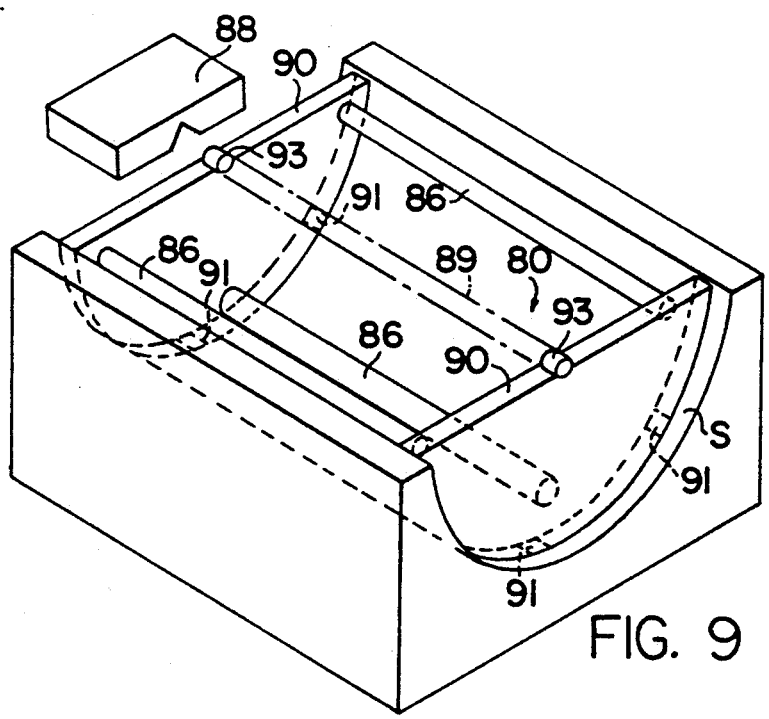
FIG. 9 illustrates an alternative embodiment to alignment correction in mounting of the beam directing assembly to the drum base.
Figure 8:
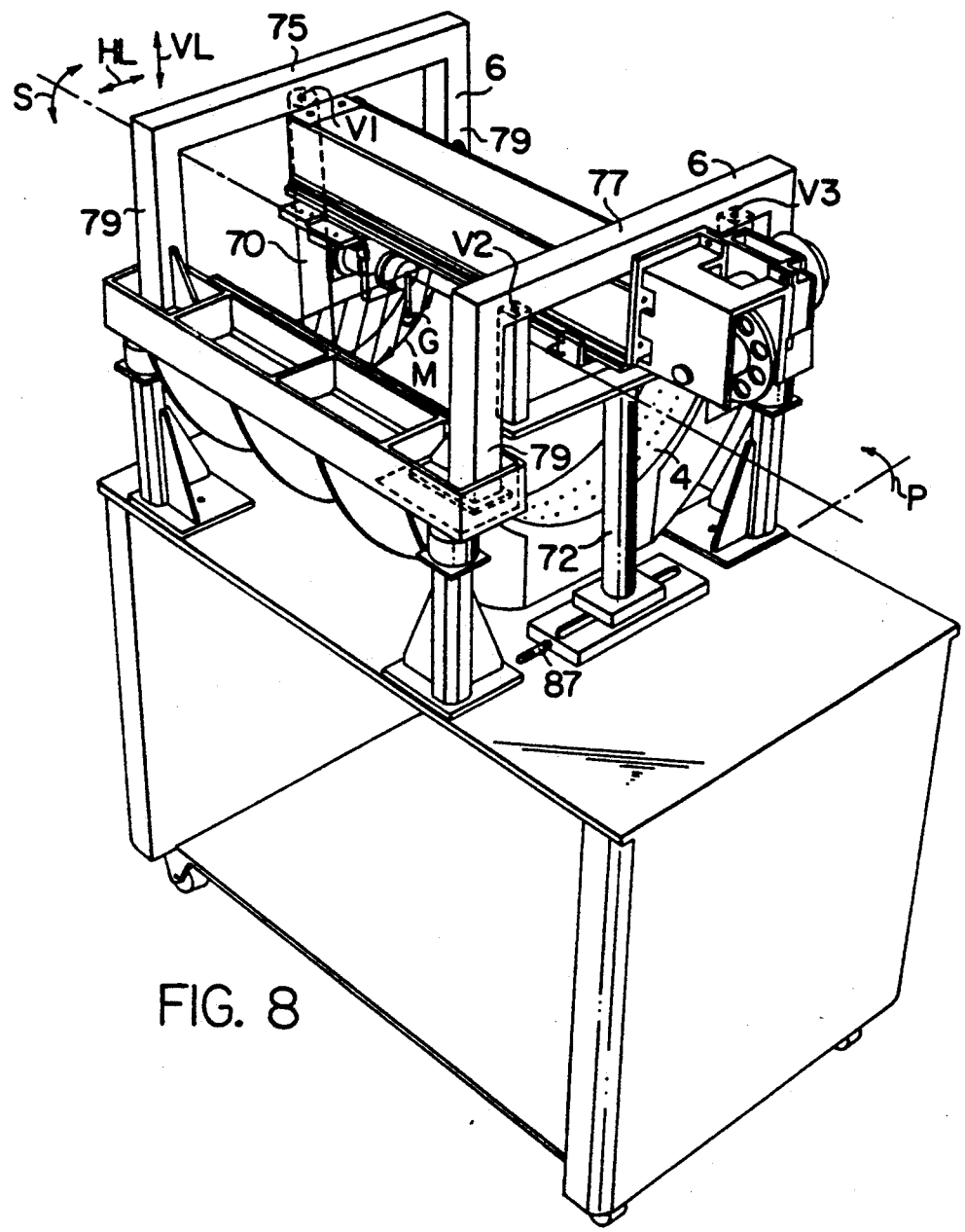
FIG. 8 is a perspective view of the plotter and a jig assembly used to fix the plotter frame to the drum support.

While the foregoing method of fabricating the drum 4 has been found to be highly accurate with certain tolerances, its a further aspect of the invention to provide a method by which irregularities outside of a given tolerance can be accounted for by fixturing the scanning frame 6 before fixing it to the support. That is, ideally speaking, the Z axis of the scanning means 8 should be one in the same with the A axis of the drum 4, but due to surface irregularities which may exist, these two axes are not perfectly continuous with one another. Thus by adjusting the orientation of the scanning means 8 relative to the surface S, a coarse mechanical compensation may first be made for any excessive surface irregularity. For this purpose, as shown in FIGS. 8 and 9, an alignment compensation system is provided wherein the frame 6 with the scanning means attached to it is suspended above the drum 4 at its first end 75 by first jig 70 and at its second end 77 by a second jig 72 such that the legs 79,79 of the frame 6 do not rest on the bottom surface of the compartments 21,21 associated with the opposed flange portions 20,20. The first jig 70 supports the frame at a single contact point V1 while the second jig 72 supports the frame at two contact points V2 and V3, thus allowing individual vertical linear and planar adjustments to be achieved. In addition to the vertical adjustment means provided by each of the first and second jigs, a lateral or side to side adjustment means 87 is also provided. This means may take various different forms, but in the preferred embodiment, they employ cross roller slides which are lead screw driven. In this way, the combined affects of the and second jigs 70 and 72 allow for adjustment to be effected in four degrees of freedom, namely in a vertical linear VL, horizontal linear HL, pitch P, and skew S. For sensing the actual cylindricity of the surface S, a gage G is secured to the axis of the spinner mirror and the probe is swung through an arc extending perpendicularly to the Z axis at different locations along the travel path of the carriage 14. Any detected variation from a given tolerance is compensated for by adjusting one or all three vertical adjustments and/or one or both of the lateral adjustments provided for in each of the first and second jigs.

As an alternative to the above process, as shown in FIG. 8, the scanning means track 1 may be suspended above the drum 4 such that it is in effect weightless. This may be done by using a conventional system of levers and counterweights. A tool 80 is provided for readily establishing the average location of the central axis of the surface S. For this, the tool 80 comprises two U-shaped end plates 90,90 connected to one another by longitudinally extending connecting members 86,86 which hold the end plates in a parallel relationship. The bottom of the plates are provided with a seating means 91,91, such as a soft plastic material, which causes the end plates to assume the contour of the surface which supports them. Between the two end plates is provided an indicator means in the form of a rod 89 or opposed centering bars 93,93 which run center span of the two end plates. Accordingly, when the tool 80 is placed on the surface S of the drum, the indicating means presents an average central axis based upon where the tool has been placed. A corresponding mating V-shaped follower member 88 is substituted for the spinner mirror and mounted to the carriage 14 and is engaged along the rod 89 or caused to span the bars 93,93 thereby translating the orientation of the track 1 to that dictated to it by the action of the follower member on the indicating means.

Once alignment of the tracking system is made in either of the two manners discussed above, a filler in liquid form is poured into each of the compartments 21,21 that receive the footings of the legs that depend from the support frame 6. The filler is poured in liquid form, but hardens to a solid condition fixing the legs 79,79 relative to the base 31 in the desired fixtured orientation. One example of a suitable filler for this purpose is made by ITW PHILADELPHIA RESINS and sold under the name SUPER ALLOY SILVER 500.

Accordingly the invention has been described by way of illustration rather than limitation.

We claim:

1. A drum support for use in a photoplotter comprising:
   a sheet of material having one surface and an opposite other surface, with the oven surface adapted for supporting an article thereon;
   a body portion having a partially cylindrical recess formed therein oriented about a given longitudinal axis, said recess having means for presenting a plurality of elevated surfaces together defining said partially cylindrical recess and providing a bed for supporting the other surface of said sheet of material;
   attachment means interposed between said sheet material and said means for presenting said plurality of elevate surfaces for bonding said sheet material to said body portion;
   said sheet of material having a thickness sufficient to allow it to be flexible so as to cause the sheet of material to conform to the partially cylindrical recess defined by the plurality of elevated surfaces when the opposite other surface of the sheet of material is bonded thereto; and
   means provided in said sheet material for communicating air between said one surface of said sheet material and said body portion of said drum.

2. A drum support as defined in claim 1 further characterized in that said drum includes two opposed flange portions which together with the body portion make up a base portion of the drum, each of said flange portions having means for supporting a radiant energy projecting source above said one surface of said sheet material.

3. A drum support as defined in claim 2 further characterized in that the partially cylindrical recess is defined by lateral side edges and said means for supporting said radiant energy projecting source includes a pair of compartments disposed in each of said flange portions having a floor disposed generally adjacent the lateral side edges of the partially cylindrical recess.

4. A support drum as defined in claim 1 further characterized in that said means for providing said plurality of elevated support surfaces being defined by a plurality of generally semicircular ribs each substantially having a common radius of curvature and being spaced apart from one another by the means for communicating air through said drum.

5. A support base as defined in claim 4 further characterized in that said plurality of ribs are equidistantly spaced from one another by channel means and are interrupted generally midlength thereof by a gap for communicating vacuum circumferentially and longitudinally along said given longitudinal axis, and at least one duct formed in the base and communicating with the channel means for introducing vacuum to said support surface.

6. A support drum as defined in claim 5 further characterized in that said support drum is formed by casting and is made from aluminum material.

7. A support drum as defined in claim 3 further characterized in that each of said oppositely disposed flanges includes at least two box-like members positioned at four corners of the drum support.

8. A support drum as defined in claim 6 further characterized in that said sheet material is made from aluminum having a thickness of approximately 0.02 inch.

* * * * *

UNITED STATES PATENT AND TRADEMARK OFFICE
CERTIFICATE OF CORRECTION

PATENT NO. : 5,276,465

DATED : January 4, 1994

INVENTOR(S) : Menard, Seniff, Petersen

It is certified that error appears in the above-identified patent and that said Letters Patent is hereby corrected as shown below:

Column 1

Line 32, after the first occurrence of "to" insert --provide--.

Column 5

Line 48, after "surface" insert --U--.
Line 54, delete "sam" and substitute --same--.

Column 6

Line 19, delete the first occurrence of "and".

UNITED STATES PATENT AND TRADEMARK OFFICE
CERTIFICATE OF CORRECTION

PATENT NO. : 5,276,465
DATED : January 4, 1994
INVENTOR(S) : Menard, Seniff, Petersen It is certified that error appears in the above-indentified patent and that said Letters Patent is hereby corrected as shown below:

Column 7, claim 1, line 5, delete "oven" and substitute --one--
line 17, delete "elevate" and substitute --elevated--

Signed and Sealed this

Twenty-fourth Day of May, 1994

Attest:

BRUCE LEHMAN

*Attesting Officer*  *Commissioner of Patents and Trademarks*